United States Patent

Nakamura

Patent Number: 5,654,987
Date of Patent: Aug. 5, 1997

[54] CLOCK RECOVERY CIRCUIT WITH REDUCED JITTER

[75] Inventor: Seizo Nakamura, Tokyo, Japan

[73] Assignee: Oki Electric Industry Co., Ltd., Tokyo, Japan

[21] Appl. No.: 457,440

[22] Filed: Jun. 1, 1995

[30] Foreign Application Priority Data

Jun. 17, 1994 [JP] Japan .................. 6-135528

[51] Int. Cl.$^6$ ................................ H04L 7/00
[52] U.S. Cl. .................. 375/355; 375/354; 375/376; 375/294
[58] Field of Search .................. 375/355, 360, 375/293, 376, 294, 371, 354

[56] References Cited

U.S. PATENT DOCUMENTS

| | | | |
|---|---|---|---|
| 4,339,823 | 7/1982 | Presona et al. | 375/376 |
| 4,651,026 | 3/1987 | Serfaty et al. | 375/294 |
| 4,700,357 | 10/1987 | Ast . | |
| 5,121,411 | 6/1992 | Fluharty . | |
| 5,297,173 | 3/1994 | Hikmet et al. . | |
| 5,537,442 | 7/1996 | Nakamura | 375/376 |

FOREIGN PATENT DOCUMENTS

| | | |
|---|---|---|
| 61-265922 | 11/1986 | Japan . |
| 1-38244 | 10/1989 | Japan . |
| 4-332231 | 11/1992 | Japan . |

OTHER PUBLICATIONS

Akaiwa and Nagata, "A Linear Modulation Scheme for Digital Mobile Radio Communications", CH2190-7/85/0000-0965, IEEE, 1985.

Nobuta et al., "π/4-shift QPSK Differential Demodulator for Digital Cordless Telephone", Papers from the 1992 Spring Meeting of the Institute of Electronics, Communication, and Information Engineers of Japan.

Primary Examiner—Stephen Chin
Assistant Examiner—T. Ghebretinsae
Attorney, Agent, or Firm—Spencer & Frank

[57] ABSTRACT

A clock recovery circuit has at least two comparators that detect timings at which a digitally modulated signal crosses different levels, and generate level crossing signals at these timings. A classifying circuit classifies sequences of these level crossing signals and issues corresponding classification signals. A timing control circuit generates timing pulses from certain combinations of the level crossing signals and classification signals. A digital phase-locked loop outputs a clock signal synchronized to these timing pulses.

25 Claims, 6 Drawing Sheets

CLOCK RECOVERY CIRCUIT WITH REDUCED JITTER

BACKGROUND OF THE INVENTION

The present invention relates to a clock recovery circuit for use in digital communications.

Among the various modulation systems employed in digital communications, a typical example is π/4-shift quaternary phase-shift keying (QPSK), which encodes two-bit data values as shifts of −3π/4, −π/4, π/4, and 3π/4 radians in the phase of a carrier signal, shifting the phase by a multiple of π/4 in each symbol interval. This system has certain advantages for mobile communication systems, including high transmission efficiency and a compact, low-power differential demodulator configuration.

FIG. 10 shows the demodulator configuration. The modulated carrier signal is received at an input terminal 1. A local oscillator 2 generates an unmodulated carrier signal with a frequency substantially equal to the frequency of the modulated carrier signal. An instantaneous phase detection circuit 3 compares the phase of the modulated carrier with the phase of the unmodulated carrier and converts the difference between them to a digital value, which it outputs as an instantaneous phase signal 4. A differential phase computing circuit 5 takes the difference between the instantaneous phase signal 4 and the instantaneous phase signal 4 delayed by one symbol interval, to obtain a differential phase signal 6.

The differential phase signal 6 is supplied to a clock recovery circuit 7 and data recovery circuit 8. The clock recovery circuit 7 recovers a clock signal, which it outputs at an output terminal 9 and also sends to the data recovery circuit 8. The data recovery circuit 8 samples the differential phase signal 6 at timings given by the clock signal, decodes the sampled values to recover bits of data, and outputs the data at an output terminal 10. The clock signal output at terminal 9 is used in subsequent processing of the data output at terminal 10.

FIG. 11 shows an eye pattern obtained by superimposing, on an oscilloscope screen for example, all of the trajectories that can be followed by the differential phase signal 6. In FIG. 11 the horizontal sweep time is set to three symbol intervals, corresponding to six bits of data.

The clock recovery circuit 7 has a magnitude comparator that compares the differential phase signal 6 with a preset level and generates a timing pulse when the differential phase signal 6 crosses this level. This is illustrated in FIG. 11, which shows timing pulses 12 generated when a particular trajectory 14 crosses a level (denoted level one) corresponding to a phase angle of zero radians.

The timing pulses 12 from the magnitude comparator are conventionally supplied directly to a digital phase-locked loop. The digital phase-locked loop generates a clock signal 16 synchronized so that, for example, falling transitions of the clock signal 16 coincide, on the average, with the timing pulses 12. This clock signal 16 is the clock signal output by the clock recovery circuit 7 at output terminal 9 in FIG. 10.

The digital phase-locked loop operates by dividing the frequency of a signal supplied from an oscillator by an integer N to obtain an internal clock signal, which is then further divided by a fixed amount to obtain the recovered clock signal 16. If a falling transition of the clock signal 16 leads the timing pulses 12, the oscillator frequency is divided by a larger integer N+L for a certain number J of internal clock cycles, to retard the phase of the clock signal 16. After J internal clock cycles, the division ratio reverts to N. If a falling transition of the clock signal 16 lags the timing pulses 12, the oscillator frequency is divided by N−L for J internal clock cycles, to advance the clock phase.

The data recovery circuit 8 samples the differential phase signal 6 at rising transitions of the clock signal 16, thereby acquiring samples at points such as Tn in FIG. 11 at which the eye pattern is most open. These are the optimum timings for obtaining unambiguous values from which to recover data.

Trajectory 14 in FIG. 11 is one of two possible trajectories that can be followed during a so-called preamble period employed in many digital communication systems, in which the transmitter repeatedly sends the synchronization pattern "1001" and the differential phase signal 6 alternates between phase angles of 3π/4 and −π/4. The other trajectory 20 that can be followed in the preamble is identical to trajectory 14, but shifted by one symbol interval. The synchronization pattern is transmitted for the express purpose of enabling the phase-locked loop in the demodulator to synchronize with the phase of the differential phase signal 6.

After the preamble, the transmitter transmits a data header, then message data, during which the differential phase signal 6 can follow any of the sixteen trajectories shown in FIG. 11. Four of these trajectories cross level one at exactly the right timings 18 and 19 for locking the phase of the clock signal 16, and four more trajectories cross level one at points fairly near these timings 18 and 19. Because the other eight trajectories do not cross level one at all, the phase-locked loop only receives timing pulses about half the time during transmission of the message data, which is still adequate for keeping the clock signal correctly synchronized.

The trajectories 14 and 20 that occur in the preamble are among the four that do not cross level one at the right timings 18 and 19 and instead "jitter" around these timings by an amount denoted ±δ in FIG. 11. When the clock signal 16 is locked in correct phase, this jitter does not cause loss of phase lock. Falling transitions of the clock signal 16 alternately lead and lag the timing pulses 12 by δ, causing the phase-locked loop alternately to retard and advance the clock signal 16, with zero net effect on the clock phase.

If the clock signal is 180° out of phase, as shown by waveform 22 in FIG. 11, its falling transitions again lead and lag the timing pulses 12 alternately, causing again the phase-locked loop alternately to retard and advance the clock phase, with zero net effect. Unfortunately, the clock signal then becomes deadlocked in an out-of-phase state. Although this deadlock condition does not arise frequently, it occurs often enough to pose a communication reliability problem.

One solution to the deadlock problem, previously proposed by the inventor, is to adjust the phase of the clock signal by an amount equal to twice the jitter value δ when the clock signal leads or lags the timing pulses 12 by more than a certain angle. In practice, however, the jitter δ can attain values close to 40°, requiring a phase adjustment of approximately 80°. (In FIG. 11 the jitter is 60°, requiring an adjustment of 120°.) A system configured to perform adjustments of this size would be highly sensitive to noise, and could easily lose phase lock if the adjustment were to be applied by mistake.

Another possible solution is to detect crossings of level two instead of level one in FIG. 11, which corresponds to detecting a phase angle of π/4 instead of zero. Pulses will then be output at the correct timings 18 and 19 during the preamble, and without jitter.

After the preamble ends, however, level two becomes inappropriate, because it is crossed by only four of the sixteen trajectories in the eye pattern, and is crossed at the correct timings 18 and 19 by only the two trajectories 14 and 20. After the preamble ends, it would be preferable to switch crossing detection from level two back to level one, which provides twice as many correctly-timed pulses for controlling the phase-locked loop.

Switching between levels one and two, however, requires a determination as to whether or not the signal currently being received belongs to the preamble. Distinguishing between a preamble signal and a message data signal is a complex task, requiring the assistance of an intelligent circuit such as a microprocessor. Providing a microprocessor in the clock recovery circuit, to be used for this purpose alone, would be impractically expensive. Using an external microprocessor is also an unattractive solution, because an external processor would be loaded with other data-processing and control functions, and hence would not be readily able to undertake the task of determining the data type for the clock recovery circuit.

SUMMARY OF THE INVENTION

It is accordingly an object of the present invention to recover a clock signal from a digitally modulated signal without risk of deadlock in an out-of-phase state.

Another object of the invention is to reduce jitter of timing pulses produced by a synchronization pattern.

Yet another object is to recover a clock signal from a digitally modulated signal without having to determine whether the digitally modulated signal comprises message data or a synchronization pattern.

A further object is to recover a clock signal despite the presence of jitter caused by a frequency offset between the transmitter and receiver.

A still further object is to generate appropriate timing pulses for clock recovery both before and after acquisition of phase lock.

The invented clock recovery circuit has a plurality of comparators for detecting timings at which a digitally modulated signal crosses a plurality of levels, and generating level crossing signals at these timings. A classifying circuit classifies sequences of these level crossing signals and issues corresponding classification signals. A timing control circuit generates timing pulses in response to particular combinations of the level crossing signals and classification signals. A digital phase-locked loop synchronizes a clock signal to the timing pulses.

DETAILED DESCRIPTION OF THE INVENTION

Figure 10:
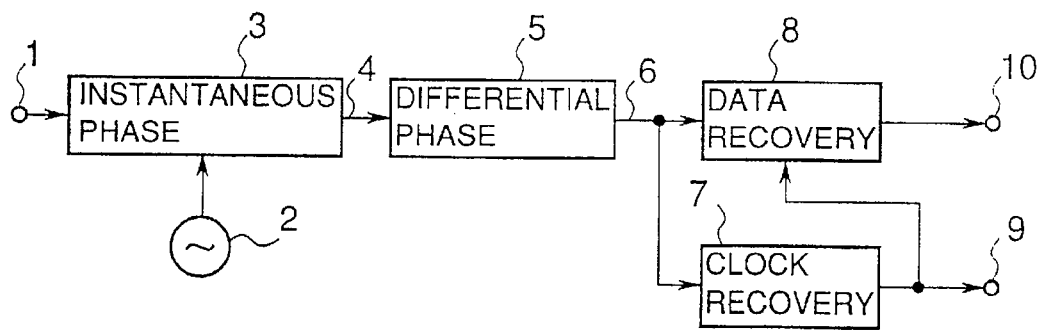
FIG. 10 is a block diagram of a π/4-shift QPSK demodulator.

Two embodiments of the invented clock recovery circuit will now be explained with reference to the attached illustrative drawings. These embodiments can be used as the clock recovery circuit 7 in the π/4-shift QPSK demodulator in FIG. 10, and will be so described. As in FIG. 10, reference numerals attached to signal lines will indicate the signal transmitted on the signal line.

Figure 1:
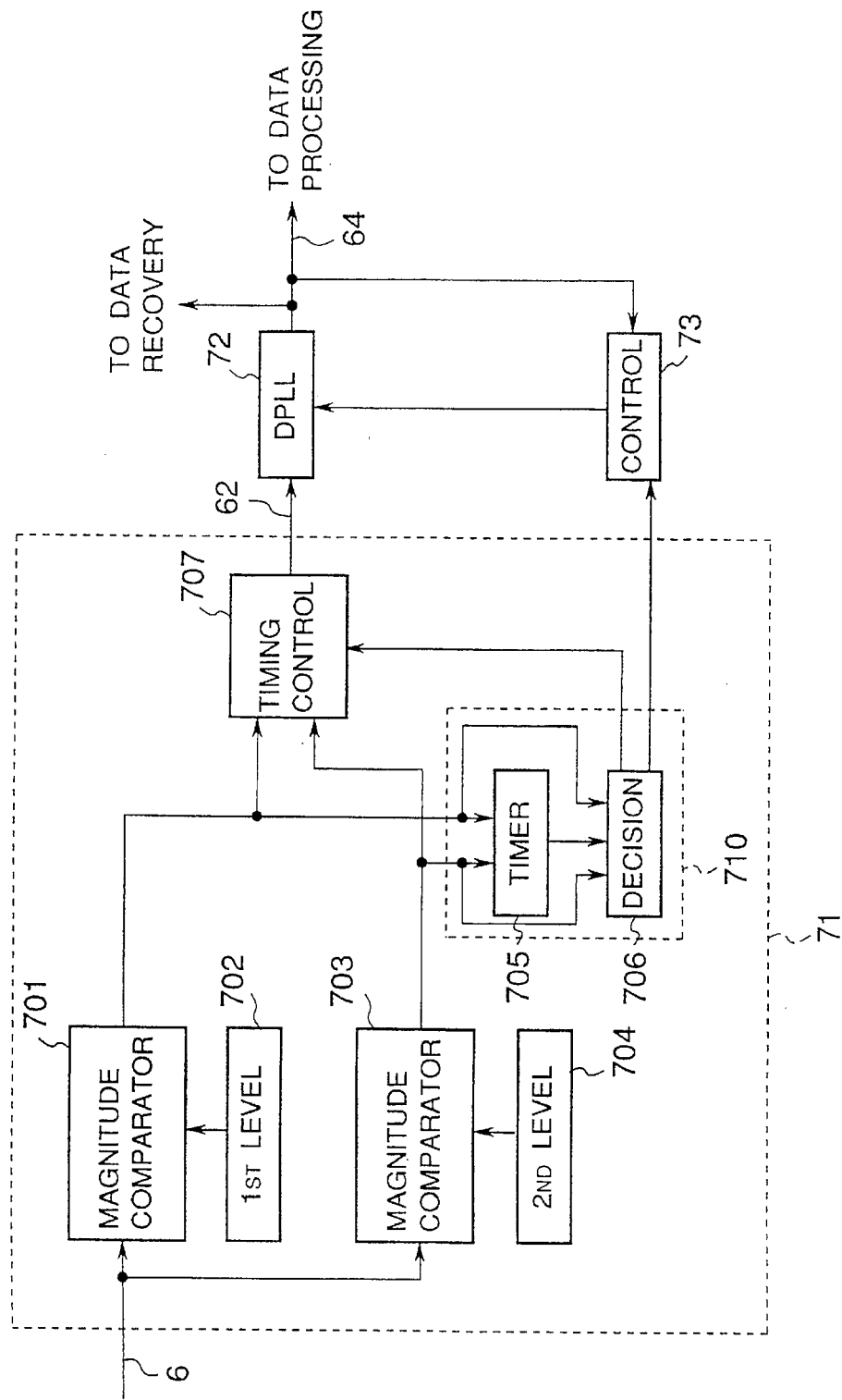
FIG. 1 is a block diagram of a first embodiment of the invention.

Referring to FIG. 1, the first embodiment comprises a timing pulse generator 71, a digital phase-locked loop (DPLL) 72, and a control circuit 73. The timing pulse generator 71 comprises magnitude comparators 701 and 703, registers 702 and 704, a classifying circuit 710, and a timing control circuit 707. The classifying circuit 710 comprises a timer 705 and a decision circuit 706.

A digitally modulated differential phase signal 6 is input to the magnitude comparators 701 and 708. Magnitude comparator 701 compares this input signal 6 with a first level supplied by register 702, and outputs a pulse when the input signal 6 crosses the first level. Magnitude comparator 703 compares the input signal 6 with a second level supplied by register 704, and outputs a pulse when the input signal 6 crosses the second level.

The pulses output by magnitude comparator 701 will be referred to as first-level-crossing pulses. The pulses output by magnitude comparator 703 will be referred to as second-level-crossing pulses. These level-crossing pulses are supplied to the classifying circuit 710 and timing control circuit 707.

In the classifying circuit 710, the level-crossing pulses are received by both the timer 705 and decision circuit 706. The timer 705 outputs time-out signals to the decision circuit 706. The decision circuit 706 outputs classification signals to the the timing control circuit 707 and control circuit 73.

From the classification signals and level-crossing pulses, the timing control circuit 707 generates timing pulses 62 and supplies them to the digital phase-locked loop 72. The digital phase-locked loop 72 uses these timing pulses and a control signal from the control circuit 73 to control the phase of a clock signal 64. The clock signal 64 is fed back to the control circuit 73, and is supplied to a data recovery circuit (shown in FIG. 10) and data processing circuits (not shown).

Next, the detailed functions of the timer 705, decision circuit 706, timing control circuit 707, digital phase-locked loop 72, and control circuit 73 will be explained.

Input of either a first-level-crossing pulse or a second-level-crossing pulse to the timer 705 resets the timer 705 and causes it to start counting. The count value represents time elapsed since the most recent level-crossing pulse. If this time reaches a certain value Td before the next reset, the timer 705 stops counting and outputs a time-out signal to the decision circuit 706.

The time-out value Td should be greater than one-third and less than one-half of the length T of the symbol interval; that is, Td should be between one-third and one-half of the period T of the clock signal to be recovered. This clock period T is known because it is the reciprocal of the baud rate of the transmitted signal. An appropriate value for Td would be approximately five-twelfths of T.

The decision circuit 706 has register circuits for storing the last three pulses received from the magnitude comparators 701 and 703 and timer 705, and logic circuits for issuing classification signals according to these pulses. The classification rule is given in Table 1. The columns headed 1st Input, 2nd Input, and 3rd Input indicate the last three pulses received, the first input being the oldest and the third input the most recent. The column headed Classification indicates the type of classification signal output by the decision circuit 706 when the third input pulse is received.

If a second-level-crossing pulse is followed by a first-level-crossing pulse with no intervening time-out pulse, the decision circuit 706 issues a first classification signal, indicated as classification 1 in Table 1. If a first-level-crossing pulse is followed by a second-level-crossing pulse with no intervening time-out pulse, the decision circuit 706 issues a second classification signal (classification 2). If a first-level-crossing pulse is preceded and followed by time-out pulses, the decision circuit 706 issues a third classification signal (classification 3) at the time of the second time-out pulse. In other cases, the decision circuit 706 issues no classification signal.

Generating these classification signals does not require microprocessor intelligence. The decision circuit 706 only needs a shift register for storing information identifying the three most recent pulses, and a simple decoder for decoding the contents of the shift register.

TABLE 1

| 1st Input | 2nd Input | 3rd Input | Classification | Timing Pulse Output Timing |
|---|---|---|---|---|
| Don't care | 2nd level crossing | 1st level crossing | 1 | 2nd level crossing + $t_0 + T/2$ |
| Don't care | 1st level crossing | 2nd level crossing | 2 | 1st level crossing + $t_0 + T/2$ |
| Time out | 1st level crossing | Time out | 3 | 1st level crossing + T/2 |
| Other cases | | | None | No output |

The timing control circuit 707 has a pair of timers for measuring elapsed time from the most recent first-level-crossing pulse and from the most recent second-level-crossing pulse. The timing control circuit 707 uses these timers to generate timing pulses at designated delays from designated level-crossing pulses.

The designations are made by the classification signal as indicated in Table 1. The delays are given in terms of T/2, which is equal to half the length of the symbol interval, and a quantity $t_0$ equal to, for example, one-sixth the length of the symbol interval ($t_0=T/6$). The delays are measured from the timing of the pulse listed in the 2nd Input column in Table 1.

If the timing control circuit 707 receives a first classification signal, it generates a timing pulse 62 at a timing delayed by $t_0+T/2$ from the second-level-crossing pulse in the 2nd Input column of Table 1, from which the first classification signal was generated. This is the most recent second-level-crossing pulse. Similarly, if the timing control circuit 707 receives a second classification signal, it generates a timing pulse 62 at a timing delayed by $t_0+T/2$ from the most recent first-level-crossing pulse. If the timing control circuit 707 receives a third classification signal, it generates a timing pulse 62 at a timing delayed by T/2 from the most recent first-level-crossing pulse. In other cases, the timing control circuit 707 does not generate a timing pulse.

The digital phase-locked loop 72 is adapted to lock the clock signal 64 in phase with these timing pulses 62 so that the timing pulses 62 coincide with rising transitions of the clock signal 64. The digital phase-locked loop 72 operates generally as described earlier, by dividing an oscillator frequency by an integer N, and temporarily changing this value when timing pulses 62 lead or lag the rising transitions of the clock signal 64. The digital phase-locked loop 72 is also adapted to alter the phase of the clock signal in response to the control signal from the control circuit 73. This alteration has a fixed size γ, which will be described later.

The control circuit 73 generates the control signal when it detects a rising transition of the clock signal followed, within time Td, by a first or second classification signal. This function can be implemented by equipping the control circuit 73 with a timer that is reset by rising transitions of the clock signal, and that times out after counting for the time Td. The control circuit 73 generates a control signal from a first or second classification signal if the classification signal occurs before the timer times out.

Next the operation of the first embodiment will be described.

Figure 2:
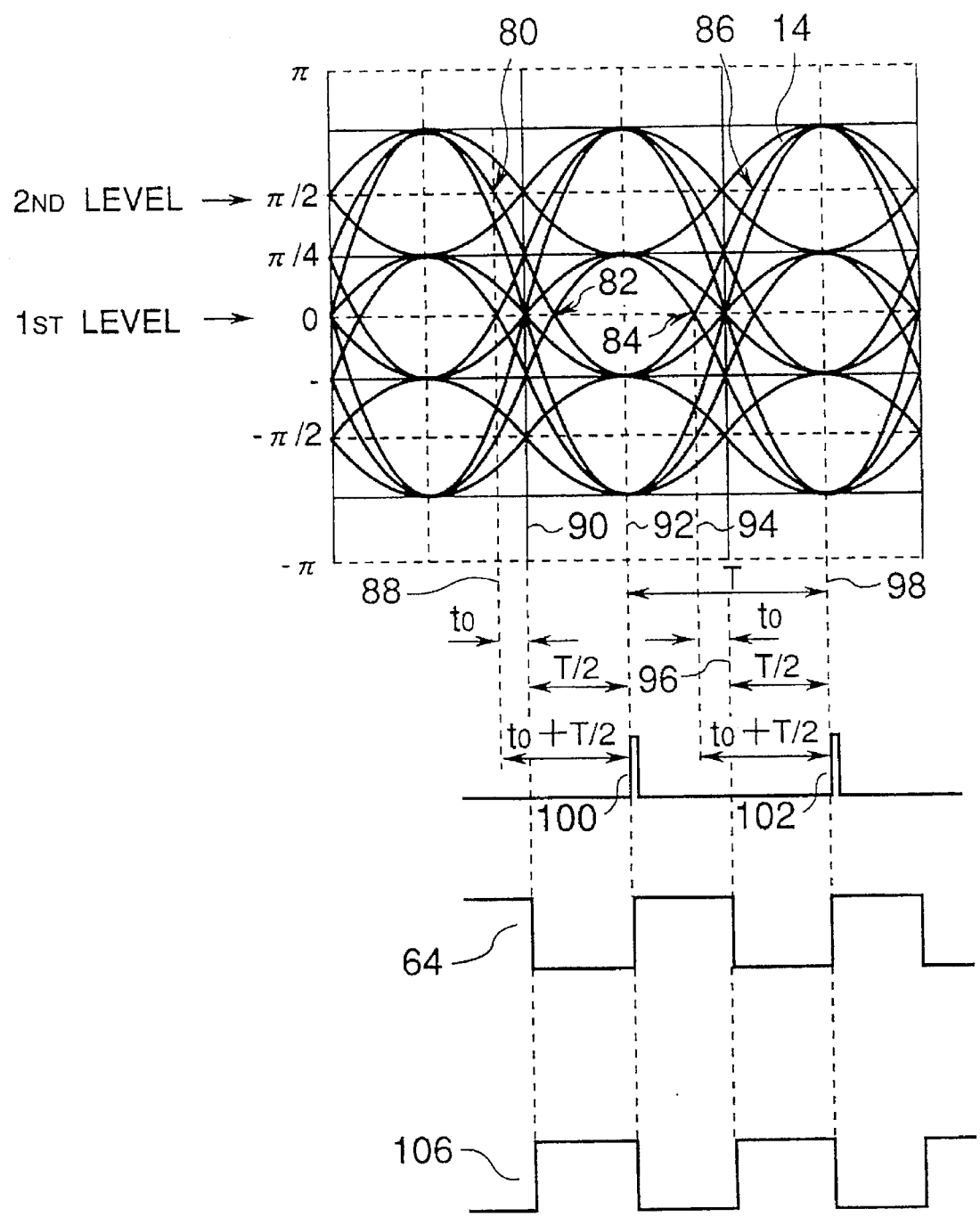
FIG. 2 is a waveform diagram illustrating an eye pattern, timing pulses, and clock signals.

Referring to FIG. 2, in the differential phase signal 6, values corresponding to $-3\pi/4$, $-\pi/4$, $\pi/4$, and $3\pi/4$ each represent two bits of transmitted data. The first level supplied by register 702 corresponds to a value of zero. The second level supplied by register 704 corresponds to $\pi/2$. These values are represented on the vertical axis in FIG. 2.

The horizontal axis represents time, the above-described durations T, T/2, and $t_0$ being indicated at various points. These durations can be conveniently stated in terms of phase angles in the symbol interval, T corresponding to 380°, T/2 to 180°, and $t_0$ to 60°.

Figure 11:
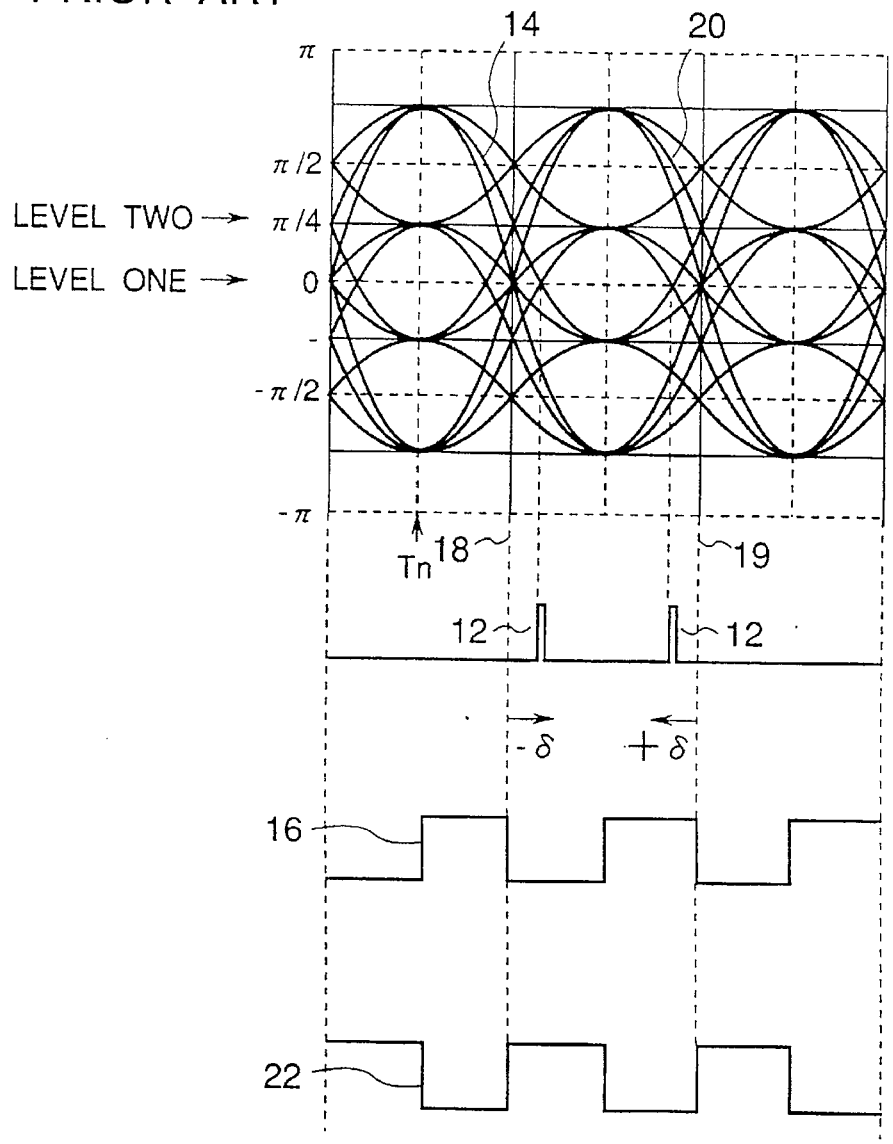
FIG. 11 is a waveform diagram illustrating an eye pattern and conventional timing pulses with jitter.

FIG. 2 shows an eye pattern of the trajectories that can be followed by the differential phase signal 6. As in FIG. 11, trajectory 14 is followed during a preamble in which the synchronization pattern "1001" is received repeatedly and the differential phase angle alternates between $3\pi/4$ and $-\pi/4$. This trajectory 14 crosses the second level ($\pi/2$) at a point 80, crosses the first level (zero) at a point 82, crosses the first level again at a point 84, and crosses the second level again at a point 86.

Timings in FIG. 2 are indicated by vertical lines. Timing 88 corresponds to crossing point 80, and timing 90 to a time delayed by $t_0$ from timing 88. Timing 92, which is delayed by T/2 from timing 90, is an optimum sampling timing, at which the eye pattern is maximally open. Timing 94 corresponds to crossing point 84. Timing 96 is delayed from timing 94 by $t_0$. Timing 98 is delayed from timing 96 by T/2, and is another optimum sampling timing.

The operation during the preamble will be described by following trajectory 14. This trajectory 14 crosses the second level ($\pi/2$) at point 80, causing magnitude comparator 703 to output a second-level-crossing pulse, and then crosses the first level at point 82, causing magnitude comparator 701 to output a first-level-crossing pulse. Because these two points are separated by twice $t_0$, or one-third of T, which is less than Td, the timer 705 does not time out, and there is no intervening time-out pulse. When the crossing at point 82 occurs, the decision circuit 706 accordingly issues a first classification signal.

This classification signal causes the timing control circuit 707 to generate a timing pulse 100 at timing 92, which is delayed by $t_0$+T2 from the timing 88 of the crossing of the second level at point 80.

In the meantime, the timer 705 has been reset at point 82, and is counting toward Td. At a time slightly past timing 92, the timer 705 reaches Td and times out. At this point the three most recent pulses received by the decision circuit 706 are a second-level-crossing pulse, a first-level-crossing pulse, and a time-out pulse. Since this pattern does not correspond to any of the three classifications in Table 1, the decision circuit 706 issues no classification signal, and the timing control circuit 707 does not generate any timing pulse in response.

Next trajectory 14 crosses the first level at point 84, followed a time $2t_0$ later by a crossing of the second level at point 86. These crossings cause the decision circuit 706 to receive first- and second-level-crossing pulses in sequence with no intervening time-out pulse, and to issue a second classification signal. The timing control circuit 707 responds by generating another timing pulse 102 at timing 98, which is delayed by $t_0$+T2 from the timing 94 of the first-level crossing at point 84.

Timing pulses 100 and 102 are generated at the optimum timings 92 and 98 when the eye pattern is most open, and are mutually separated by a duration of exactly T, with no jitter. As long as the preamble continues, timing pulses continue to be generated at these optimum timings. The digital phase-locked loop 72 can accordingly quickly capture the phase of the timing pulses and lock the clock signal 64 so that its rising transitions occur in synchronization with the timing pulses, as shown.

Absence of jitter in the timing pulses renders deadlock extremely unlikely, but complete protection against deadlock is provided by the control circuit 73. If the clock signal is 180° out of phase, as indicated by waveform 106, the control circuit 73 detects a rising transition of the clock 106 at timing 96, followed a time $t_0$ later by output of a first classification signal at point 86. Since $t_0$ is less than Td (actually less than half Td), the control circuit 73 generates a control signal causing the digital phase-locked loop 72 to adjust the phase of the clock signal by the above-mentioned amount γ, which moves the clock phase well away from the danger area around 180°. This phase adjustment also speeds up the acquisition of synchronization with the timing pulses.

Operation during data transmission, after the preamble ends, will be described with reference to FIGS. 3 to 7, which show the sixteen trajectories that can be followed by the differential phase signal 6 during two consecutive symbol intervals.

Figure 3:
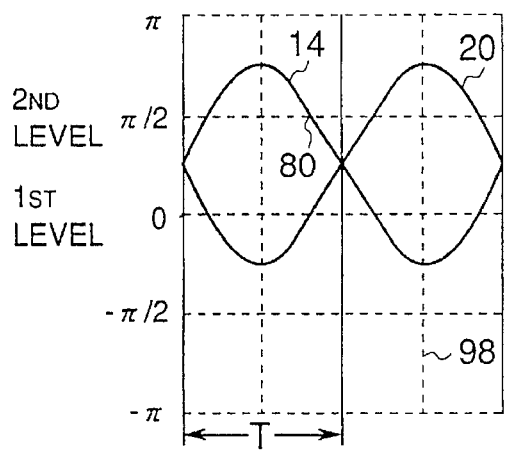
FIG. 3 illustrates two trajectories from the eye pattern in FIG. 2.

FIG. 3 shows two trajectories 14 and 20 that cross both the first level at zero radians and the second level at π/2. These two trajectories can occur during the preamble, but they can also occur during general data transmission. As described above, the timing control circuit 707 generates timing pulses at the optimum timing 98, with no jitter.

Figure 4:
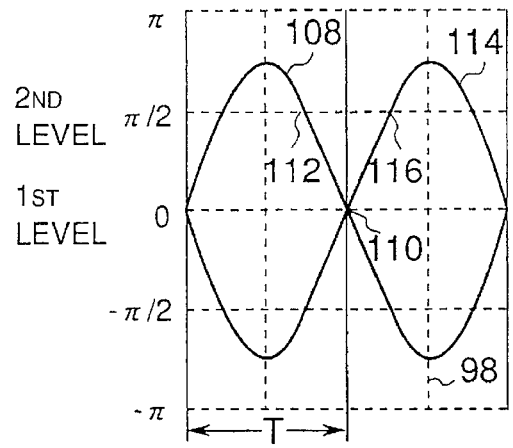
FIG. 4 illustrates two more trajectories from the eye pattern in FIG. 2.

FIG. 4 shows two more trajectories that cross both the first and second levels at zero and π/2. When trajectory 108 crosses the first level at point 110, the decision circuit 706 issues a first classification signal, and the timing control circuit 707 generates a timing pulse delayed $t_0$+T2 from the point 112 at which the second level was crossed. Because trajectory 108 descends more steeply than the corresponding trajectory 14 in FIG. 3, the crossing at point 112 occurs slightly earlier than the corresponding crossing at point 80 in FIG. 3, and the timing pulse has a small amount of jitter, being slightly advanced from the optimum timing 98.

When trajectory 114 crosses the second level at point 116, the decision circuit 706 issues a second classification signal and the timing control circuit 707 generates a timing pulse delayed by $t_0$+T2 from point 110. This timing pulse has jitter equal to $t_0$.

Figure 5:
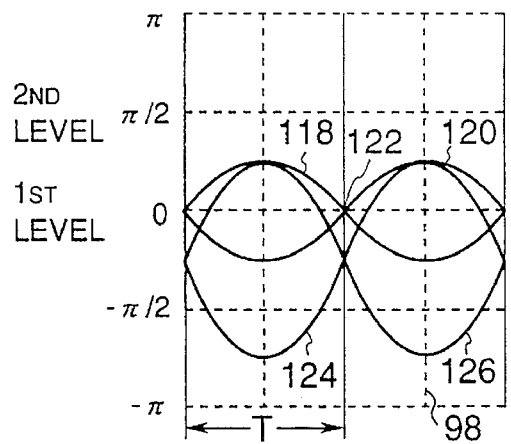
FIG. 5 illustrates four more trajectories from the eye pattern in FIG. 2.

FIG. 5 shows four trajectories that cross the first level at zero but do not cross the second level at π/2. Because all four crossings are separated by intervals of more than Td, the decision circuit 706 receives first-level-crossing pulses and time-out pulses alternately, and issues a third classification signal at each time-out pulse. The timing control circuit 707 generates a timing pulse delayed T/2 from each previous crossing of the first level at zero.

Two of the trajectories 118 and 120 cross the first level at the center point 122, producing timing pulses at the optimum timing 98. The other two trajectories 124 and 126 cross the first level before or after point 122, producing timing pulses that lead or lag the optimum timing 98.

Figure 6:
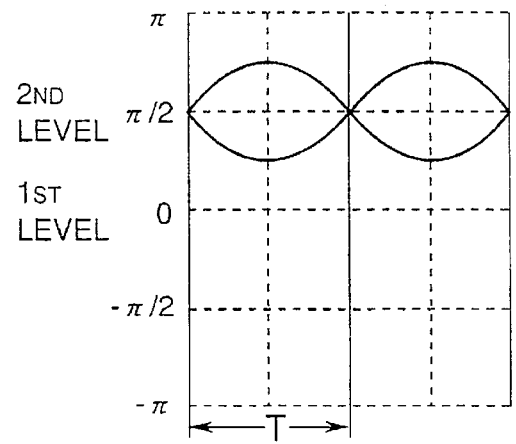
FIG. 6 illustrates two more trajectories from the eye pattern in FIG. 2.

FIG. 6 shows two trajectories that cross the second level at π/2 but do not cross the first level at zero. These trajectories do not meet any of the classification conditions in Table 1, so they produce no timing pulses.

Figure 7:
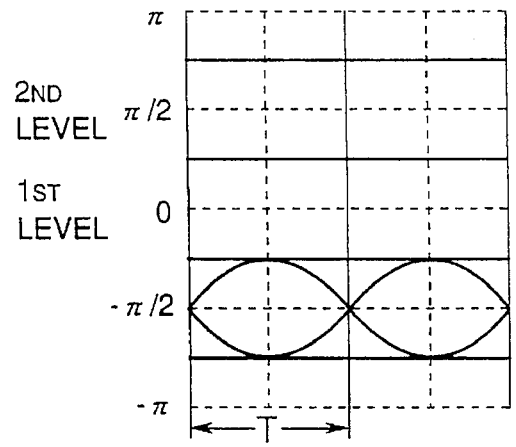
FIG. 7 illustrates six more trajectories from the eye pattern in FIG. 2.

FIG. 7 shows six more trajectories that do not cross either the first or the second level. These trajectories also produce no timing pulses.

Of the sixteen trajectories in FIGS. 3 to 7, four trajectories 14, 20, 118, and 122 produce timing pulses with no jitter, one trajectory 108 produces timing pulses with a very small amount of jitter, and three more trajectories 114, 124, and 126 produce timing pulses with more substantial jitter. For comparison, the conventional method of generating timing pulses at crossings of level one in FIG. 11 generates jitter-free timing pulses in four out of sixteen cases, and timing pulses with substantial jitter in four more cases. Since the conventional timing pulses suffice for maintaining phase lock, the timing pulses generated in the first embodiment also suffice.

As described above, the first embodiment provides completely jitter-free timing pulses in all symbol intervals during the preamble, and timing pulses in half the symbol intervals during data transmission, with no need to distinguish between preamble and message data or to switch the levels at which crossings are detected. Phase lock can accordingly be quickly acquired and reliably maintained without the assistance of a microprocessor.

Figure 8:
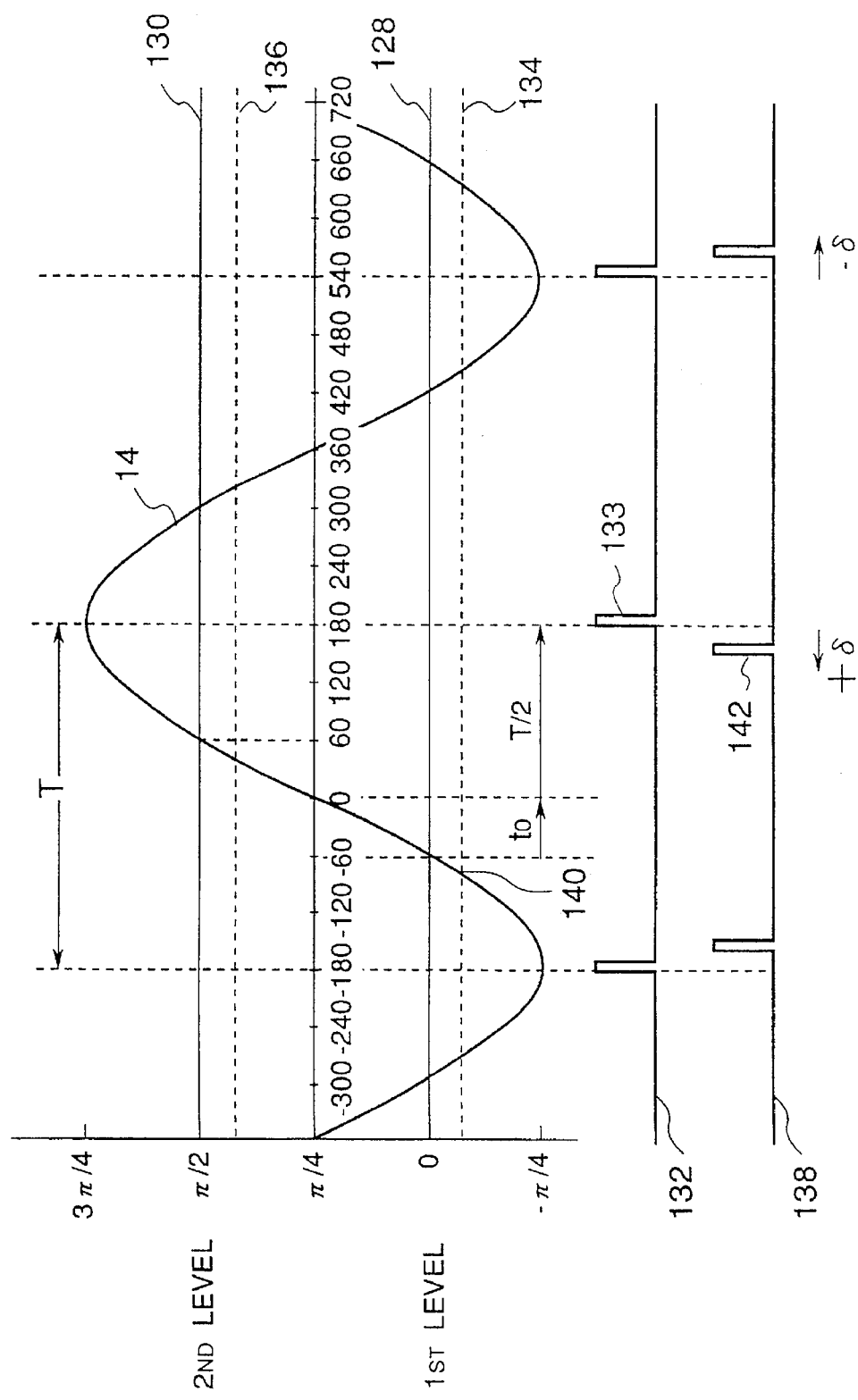
FIG. 8 is a waveform diagram illustrating jitter caused by frequency offset.

The trajectories in FIGS. 2 to 7 assume perfect matching of carrier frequencies at the transmitter and receiver. FIG. 8 shows the effect of a carrier frequency offset between the transmitter and receiver, for the preamble trajectory 14 that alternates between values of 3π/4 and −π/4. Time on the horizontal axis is shown measured in degree units, one symbol interval (T) being equivalent to 360°.

If there is no frequency offset, trajectory 14 crosses the first level 128 and second level 130 so as to produce jitter-free timing pulses 132, as described above. For example, the crossings of the first level 128 and second level 130 at the −60° and +60° points produce a timing pulse 133 at the +180° point.

A frequency offset causes the entire eye pattern of the differential phase signal, including trajectory 14, to move up or down in relation to the first and second levels 128 and 130. Equivalently, the first and second levels move down or up in relation to the eye pattern. The horizontal dotted lines in FIG. 8 illustrate this effect when the transmitter's carrier frequency is higher than the receiver's carrier frequency, causing the first and second levels to move down relative to trajectory 14.

Due to the frequency offset, the first level moves down from position 128 to a new position 134, and the second level moves down from position 130 to a new position 136. As a result, crossings of these levels are detected earlier or later than before, and timing pulses 138 are produced with jitter of ±δ.

Despite this jitter, the control signals output by the control circuit 73 prevent deadlock. As described earlier, each control signal causes the digital phase-locked loop 72 to perform a phase adjustment of a certain size γ. This size γ is selected to be twice the maximum anticipated jitter δ resulting from frequency offset. As in the inventor's previous proposal, an adjustment of this size ensures that deadlock cannot occur.

For many communication systems, the maximum jitter δ due to frequency offset is not very large. In a digital cordless telephone system employing π/4-shift QPSK, for example, the bit rate is 384 kilobits per second (192 kilobaud, since two bits constitute one symbol), and the carrier frequency is 1900 MHz. The carrier frequency tolerance in the transmitter and receiver is ±3 parts per million. These are statistical tolerances given in terms of standard deviations, and the tolerance of the combined frequency offset between transmitter and receiver is the square root of the sum of the squares of the individual transmitter and receiver tolerances. The maximum frequency offset can accordingly be considered equal to 4.2 parts per million, which is:

$$1900 \times 10^6 \times 4.2 \times 10^{-6} = 7980 \text{ Hz}$$

The eye-pattern offset of the differential phase signal is obtained by multiplying the frequency offset by the length of one symbol interval, which is the reciprocal of the baud rate. In terms of phase angle, the maximum eye-pattern offset is accordingly:

$$[7980 \times 1/(192 \times 10^3)] \times 360° = 15° = 15\pi/180 \text{ radians}$$

If the difference between the two positions 128 and 134 of the first level in FIG. 8 has this maximum value of 15π/180 radians, the point 140 where trajectory 14 crosses the first level 134 can be calculated by solving the following equation for θ:

$$-15\pi/180 = \pi/4 + \pi\{\sin(\theta/2)\}/2$$
$$\theta = -1.44 \text{ radians}$$
$$= -82.5°$$

This produces a timing pulse 142 at the following position:

$$-82.5° + 60° + 180° = 157.5°$$

The offset between this timing pulse 142 and the correct timing pulse 133 is 22.5°. This is the maximum jitter value.

In this example, the size γ of the phase adjustment applied by the digital phase-locked loop 72 in response to a control signal from the control circuit 73 can accordingly be 45°. An adjustment of this size can be applied safely; even if applied by mistake, it will not cause the digital phase-locked loop 72 to lose lock.

Incidentally, the sine waves shown in FIGS. 2 to 8 overestimate the jitter that occurs in many actual systems. Ideally, a digitally modulated signal such as the differential phase signal being considered here should have a square waveform, which always results in jitter-free timing pulses. Waveforms in actual digital communication systems generally lie somewhere between a square wave and a sine wave, so that while the jitter may not be zero, it can be less than shown in the drawings.

The value $t_0$ should be selected to reflect typical conditions, and the value of γ to reflect worst-case conditions. If typical conditions are closer to square waves than are the sine waves shown in the drawings, the value of $t_0$ should be reduced from T/6 to a smaller value. The values of Td and γ can also be reduced if so desired, although Td must still be greater than twice $t_0$.

Next, a second embodiment of the present invention will be described. This embodiment is similar to the first, but gates the second-level-crossing pulses according to the phase angle between rising clock transitions and timing pulses.

Figure 9:
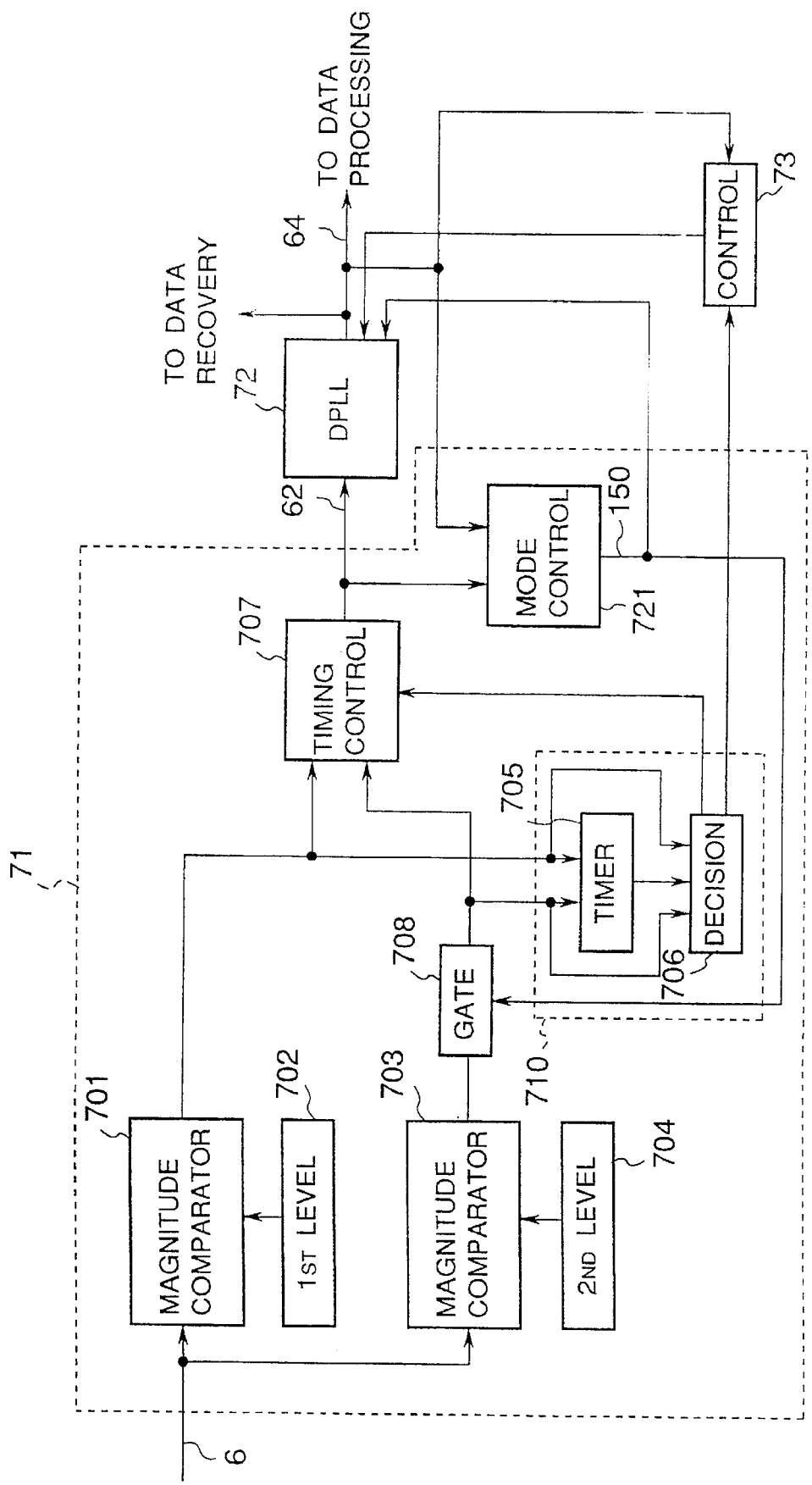
FIG. 9 is a block diagram of a second embodiment of the invention.

FIG. 9 shows the structure of the second embodiment, using the same reference numerals as in FIG. 1 to identify identical or corresponding parts. The new elements are a gate circuit 708 and a mode control circuit 721.

The digital phase-locked loop 72 in the second embodiment is adapted to operate in two modes: a fast control mode and a slow control mode. In its fast control mode the digital phase-locked loop 72 operates, for example, as described above, retarding or advancing the phase of the clock signal 64 each time a rising transition of the clock signal 64 leads or lags a timing pulse 62. In the slow control mode, the digital phase-locked loop 72 responds more slowly to differences between the clock signal 64 and timing pulses 62, by averaging lead and lag over a certain number of clock cycles, for example. Digital phase-locked loops of this type are well known in the art.

The mode control circuit 721 receives timing pulses 62 from the timing control circuit 707 and the clock signal 64 from the digital phase-locked loop 72, detects the phase angle between them, and generates a mode control signal 150 that selects the fast or slow control mode. Fast control mode is selected when the phase angle exceeds a certain mode-switching value, such as 45°. Slow control mode is selected when the phase angle does not exceed this value. The mode control signal 150 is supplied to the digital phase-locked loop 72 and gate circuit 708.

The gate circuit 708 receives second-level-crossing pulses from magnitude comparator 703. When the mode control signal 150 selects the fast control mode, the gate circuit 708 passes the second-level-crossing pulses on to the timing control circuit 707 and classifying circuit 710. When the mode control signal selects the slow control mode, the gate circuit 708 closes, blocking the second-level-crossing pulses so that they do not reach the timing control circuit 707 and classifying circuit 710.

Next the operation of the second embodiment will be described.

When the phase angle between the timing pulses 62 and clock signal 64 exceeds the mode-switching value, since the gate circuit 708 is open, the second embodiment operates exactly like the first embodiment.

When the phase angle between the timing pulses 62 and clock signal 64 is equal to or less than the mode-switching value, the gate circuit 708 closes and the timing control circuit 707 and classifying circuit 710 receive only first-level-crossing pulses. Since none of the trajectories in FIGS. 3 to 7 cross the first level twice within less than half a symbol interval T, and since the time-out time Td of the timer 705 is less than one-half T, the timer 705 will time out following every first-level-crossing pulse, and the decision circuit 706 will receive first-level-crossing pulses and time-out pulses in alternation.

From Table 1 it can be seen that this causes the decision circuit 706 to issue a third classification signal at every time-out pulse, and the timing control circuit 707 to generate a timing pulse 62 delayed by T2 from the preceding crossing of the first level. Such timing pulses will be generated for every crossing of the first level.

As a result, during slow control mode the two trajectories in FIG. 3 will generate timing pulses with equal and opposite amounts of jitter. The two trajectories in FIG. 4 will generate jitter-free timing pulses 62. The four trajectories in FIG. 5 will generate the same timing pulses 62 as in the first embodiment.

In the first embodiment there was an asymmetry between the timing pulses generated by the trajectories in FIG. 4, trajectory 112 producing a small leading jitter and trajectory 114 a larger lagging jitter. The second embodiment removes this asymmetry, so that the average jitter is zero. This is particularly desirable in the slow control mode, in which the digital phase-locked loop 72 responds to average lead or lag of the timing pulses.

By producing jitter-free timing pulses during the preamble and pulses with an average jitter of zero during data transmission, the second embodiment can provide timing pulses with properties advantageous for both capturing phase lock under fast control and maintaining phase lock under slow control. Use of a digital phase-locked loop 72 with a slow control mode is particularly advantageous for maintaining phase lock, since it makes the clock recovery circuit less susceptible to noise.

The first embodiment can also employ a digital phase-locked loop 72 with fast and slow control modes, and a mode control circuit 721 for switching between these two modes. The mode control circuit 721 can be built into the digital phase-locked loop 72. Slow control is advantageous in the phase-locked state even without gating of the second-level-crossing pulses.

The second embodiment can be modified by supplying the mode selection signal 150 to the decision circuit 706, and modifying the classification logic so that in slow control model, the decision circuit 706 issues a third classification signal at every first-level-crossing pulse, regardless of whether or not it is followed by a time-out pulse. The timer 705 can then be switched off in slow control mode. This modification assures that a timing pulse 62 is generated for every first-level crossing, even if noise or distortion causes these crossings to occur earlier or later than shown in FIGS. 3 to 7.

While this modification has the advantage of assuring an adequate supply of timing pulses even in the presence of noise or distortion, it has the disadvantage of allowing such noise or distortion to produce spurious timing pulses. In slow control mode, however, the digital phase-locked loop 72 is relatively immune to the effects of such spurious pulses.

Although the two embodiments above were described as receiving a differential phase signal, the input signal can be any type of digitally modulated signal having an eye pattern as shown in FIGS. 2 to 7. The invention can accordingly be practiced in digital communication systems generally, and not just in systems employing π/4-shift QPSK modulation.

If the modulation scheme has more than four levels, leading to a more complex eye pattern, the trajectory classification logic of the decision circuit 708 can be modified accordingly. Crossings of more than two levels can be detected if necessary, to enable more accurate classification.

Also, if a π/4-shift QPSK system employs a synchronization pattern other than "1001," the crossing detection levels or classification logic can modified as necessary to assure output of jitter-free timing pulses while the synchronization pattern is being transmitted.

Even for the π/4-shift QPSK system and synchronization pattern described above, the classification logic can be modified in various ways. For example, the third classification signal could be issued when a first-level-crossing pulse is neither preceded nor followed by a second-level-crossing pulse within time Td; that is, when a first-level-crossing pulse is preceded and followed by any two pulses, neither of which is a second-level-crossing pulse.

The digital phase-locked loop in the preceding embodiments was adapted to lock rising transitions of the clock signal to the timing pulses, but it could of course be adapted to lock falling transitions of the clock signal to the timing pulses.

Those skilled in the art will recognize that many further modifications are possible without departing from the scope claimed below.

What is claimed is:

1. A clock recovery circuit for recovering a clock signal from a digitally modulated signal, comprising:

a plurality of comparators for detecting crossings by said digitally modulated signal of a corresponding plurality of levels, and generating respective level crossing signals when such crossings occur;

a classifying circuit coupled to said comparators, for issuing classification signals responsive to certain sequences of said level crossing signals;

a timing control circuit coupled to said classifying circuit, for generating timing pulses delayed by certain amounts from said level crossing signals, responsive to said classification signals; and a digital phase-locked loop coupled to said timing control circuit, for generating said clock signal and locking said clock signal in phase to said timing pulses.

2. The clock recovery circuit of claim 1, wherein said classifying circuit further comprising a timer for receiving said level crossing signals and generating time-out signals if a certain time elapses from any one of said level crossing signals without reception of another one of said level crossing signals.

3. The clock recovery circuit of claim 2, wherein said classifying circuit further comprising a decision circuit for receiving said time-out signals from said timer, and generating said classification signals responsive to specific sequences of said level crossing signals and said time-out signals.

4. The clock recovery circuit of claim 3, wherein:

said plurality of comparators comprise a first comparator that detects crossings of a first level and generates first-level-crossing signals, and a second comparator that detects crossings of a second level and generates second-level-crossing signals;

said decision circuit generates a first classification signal in response to a second-level-crossing signal followed by a first-level-crossing signal with no intervening time-out signal;

said decision circuit generates a second classification signal in response to said first-level-crossing signal followed by said second-level-crossing signal with no intervening time-out signal; and said decision circuit generates a third classification signal in response to said first-level-crossing signal preceded and followed by time-out signals.

5. The clock recovery circuit of claim 4, wherein:

in response to said first classification signal, said timing control circuit generates a timing pulse delayed by a first amount from the second-level-crossing signal from which said first classification signal was generated;

in response to said second classification signal, said timing control circuit generates said timing pulse delayed by said first amount from the first-level-crossing signal from which said second classification signal was generated; and in response to said third classification signal, said timing control circuit generates said timing pulse delayed by a second amount from the first-level-crossing signal from which said third classification signal was generated.

6. The clock recovery circuit of claim 1, wherein said digital phase-locked loop is adapted to adjust said clock signal by a certain phase adjustment amount in response to a control signal, and said clock recovery circuit further comprises:

a control circuit for receiving said clock signal and said classification signals, and generating said control signal responsive to said classification signals and a Certain transition of said clock signal.

7. The clock recovery circuit of claim 6, wherein:

said digitally modulated signal is subject to offset due to a frequency difference between a transmitter at which said digitally modulated signal originates and a receiver in which said clock recovery circuit is disposed;

said offset produces jitter in said timing pulses; and said phase adjustment amount is twice a maximum amount of jitter produced in said timing pulses by said offset.

8. The clock recovery circuit of claim 1, wherein:

said digital phase-locked loop has a fast control mode and a slow control mode; and said clock recovery circuit has a mode control circuit for receiving said timing pulses and said clock signal, selecting said fast control mode when said clock signal differs in phase from said timing pulses by more than a certain quantity, and selecting said slow control mode when said clock signal differs in phase from said timing pulses by less than said quantity.

9. The clock recovery circuit of claim 8, further comprising a gate circuit coupled to one of said comparators, for blocking level crossing pulses from said one of said comparators when said slow control mode is selected.

10. A clock recovery circuit for recovering a clock signal from a digitally modulated signal, comprising:.

a first comparator for generating a first-level-crossing pulse when said digitally modulated signal crosses a certain first level;

a second comparator for generating a second-level-crossing pulse when said digitally modulated signal crosses a certain second level different from said first level;

a classifying circuit coupled to said first comparator and said second comparator, for issuing classification signals responsive to combinations of said first-level-crossing pulse and said second-level-crossing pulse;

a timing control circuit coupled to said classifying circuit, for generating timing pulses responsive to combinations of said first-level-crossing pulse, said second-level-crossing pulse, and said classification signals; and a digital phase-locked loop coupled to said timing control circuit, for generating said clock signal and adjusting said clock signal in phase so as to synchronize certain transitions of said clock signal with said timing pulses.

11. The clock recovery circuit of claim 10, wherein said classification signals comprise a first classification signal, a second classification signal, and a third classification signal, and wherein said classifying circuit generates said first classification signal if said second-level-crossing pulse is followed by said first-level-crossing pulse within a certain time, generates said second classification signal if said first-level-crossing pulse is followed by said second-level crossing pulse within said certain time, and generates said third classification signal if said first-level-crossing pulse is neither preceded nor followed by said second-level-crossing pulse within said certain time.

12. The clock recovery circuit of claim 11, wherein:

after receiving said second-level-crossing pulse followed by said first classification signal, said timing control circuit generates a timing pulse delayed by a first amount from said second-level-crossing pulse;

after receiving said first-level-crossing pulse followed by said second classification signal, said timing control circuit generates said timing pulse delayed by said first amount from said first-level-crossing pulse; and after receiving said first-level-crossing pulse followed by said third classification signal, said timing control circuit generates said timing pulse delayed by a second amount from said first-level-crossing pulse.

13. The clock recovery circuit of claim 11, further comprising a control circuit coupled to said classifying circuit and said digital phase-locked loop, for generating a control signal when one of said certain transitions of said clock signal is followed within said certain time by one of said classification signals other than said third classification signal, said control signal causing said digital phase-locked loop to adjust said clock signal by a certain fixed phase amount.

14. The clock recovery circuit of claim 13, wherein said fixed phase amount is equal to twice a maximum jitter amount of said timing pulses due to frequency offset between a transmitter that transmits said digitally modulated signal and a receiver that receives said digitally modulated signal.

15. The clock recovery circuit of claim 10, wherein:

said digital phase-locked loop adjusts said clock signal at a first rate when said clock signal differs from said timing pulses by more than a certain phase angle, and at a second rate when said clock signal differs from said timing pulses by less than said phase angle, said first rate being faster than said second rate.

16. The clock recovery circuit of claim 15, further comprising a gate circuit coupled to said second comparator for disabling output of said second-level-crossing pulse when said clock signal differs from said timing pulses by less than said phase angle.

17. A method of recovering a clock signal from a digitally modulated signal, comprising the steps of:

comparing said digitally modulated signal with a plurality of levels, and generating respective level crossing signals when said digitally modulated signal crosses said levels;

classifying sequences of said level crossing signals, and issuing corresponding classification signals;

generating timing pulses delayed by certain amounts from said level crossing signals, responsive to said classification signals; and generating said clock signal and locking said clock signal in phase to said timing pulses.

18. The method of claim 17, further comprising the step of generating time-out signals if a certain time elapses from any one of said level crossing signals without reception of another one of said level crossing signals.

19. The method of claim 18, wherein said classification signals are issued in response to sequences of said level crossing signals and said time-out signals.

20. The method of claim 19, wherein: said level crossing signals comprise a first-level-crossing signal generated when said digitally modulated signal crosses a first level, and a second-level-crossing signal generated when said digitally modulated signal crosses a second level; and said classification signals comprise a first classification signal issued when said second-level-crossing signal is followed by said first-level-crossing signal with no intervening time-out signal, a second classification signal issued when said first-level-crossing signal is followed by said second-level-crossing signal with no intervening time-out signal; and a third classification signal issued when said first-level-crossing signal is preceded and followed by time-out signals.

21. The method of claim 20, wherein the step of generating timing pulses further comprises:

in response to said first classification signal, generating a timing pulse at a first elapsed time from a most recent second-level-crossing signal;

in response to said second classification signal, generating said timing pulse at said first elapsed time from a most recent first-level-crossing signal.; and in response to said third classification signal, generating said timing pulse at a certain second elapsed time from said most recent first-level-crossing signal.

22. The method of claim 17, further comprising the step of adjusting said clock signal by a certain phase adjustment amount responsive to said classification signals and a specific transition of said clock signal.

23. The method of claim 22, wherein:

said digitally modulated signal is subject to offset due to a frequency difference between a transmitter at which said digitally modulated signal originates and a receiver in which said clock recovery circuit is disposed;

said offset produces jitter in said timing pulses; and said phase adjustment amount is twice a maximum amount of jitter produced in said timing pulses by said offset.

24. The method of claim 17 wherein, in said step of generating said clock signal, locking of said clock signal in phase to said timing pulses is performed in a fast control mode when said clock signal differs in phase from said timing pulses by more than a certain quantity, and in a slow control mode when said clock signal differs in phase from said timing pulses by less than said certain quantity.

25. The method of claim 24, wherein level crossing pulses generated when said digitally modulated signal crosses a certain one of said levels are blocked during said slow control mode and are not used in said step of classifying sequences.

* * * * *